(12) United States Patent
Voutsas et al.

(10) Patent No.: US 6,733,931 B2
(45) Date of Patent: May 11, 2004

(54) SYMMETRICAL MASK SYSTEM AND METHOD FOR LASER IRRADIATION

(75) Inventors: Apostolos Voutsas, Vancouver, WA (US); Mark A. Crowder, Portland, OR (US); Yasuhiro Mitiani, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 73 days.

(21) Appl. No.: 10/099,376

(22) Filed: Mar. 13, 2002

(65) Prior Publication Data

US 2003/0175599 A1 Sep. 18, 2003

(51) Int. Cl.$^7$ ................................................ H01L 21/00
(52) U.S. Cl. ........................... 430/5; 430/394; 430/945; 428/795; 219/121.6; 219/121.65; 219/121.66; 219/121.85
(58) Field of Search ........................... 430/5, 394, 396, 430/945; 438/795; 355/53; 219/121.6, 121.65, 121.66, 121.85

(56) References Cited

U.S. PATENT DOCUMENTS 5,932,118 A * 8/1999 Yamamoto et al. .... 219/121.66
6,326,286 B1 * 12/2001 Park et al. .................. 438/478
2003/0171007 A1 * 9/2003 Voutsas et al. ............. 438/795

OTHER PUBLICATIONS

J.S. Im and H.J. Kim, Appl. Phys. Lett., 63, 1969 (1993).
R. Sposili and J.S. Im, Appl. Phys. Lett., 69, 2864 (1996).
J.S. Im, Phys. Stat. Sol. A, 166,603 (1998).
J.S. Im, R.S. Sposili, and M.A. Crowder, Appl. Phys. Lett., 70, 3434 (1997).

* cited by examiner

Primary Examiner—John A. McPherson
(74) Attorney, Agent, or Firm—David C. Ripma; Matthew D. Rabdau

(57) ABSTRACT

A system and method are provided for laser irradiating a semiconductor substrate using a multi-pattern mask. The method comprises: exposing a semiconductor substrate to laser light projected through a multi-pattern mask; advancing the mask and substrate in a first direction to sequentially expose adjacent areas of the substrate to each of the mask patterns in a first predetermined order; and, advancing the mask and substrate in a second direction, opposite the first direction, to sequentially expose adjacent areas of the substrate to each of the mask patterns in the first order. In one aspect, the method further comprises: forming a multi-pattern mask having a first plurality patterns aligned in the first order with respect to the first direction and a second plurality of patterns, corresponding to the first plurality of patterns, aligned in the first order with respect to the second direction. Alternately, the method comprises: forming a first multi-pattern mask having a first plurality patterns aligned in the first order with respect to the first direction; and, forming a second multi-pattern mask having a second plurality of patterns, corresponding to the first plurality of patterns, aligned in the first order with respect to the second direction. Then, advancing the mask and substrate in the first direction includes using the first mask, and advancing the mask and substrate in the second direction, opposite the first direction, includes using the second mask.

33 Claims, 5 Drawing Sheets

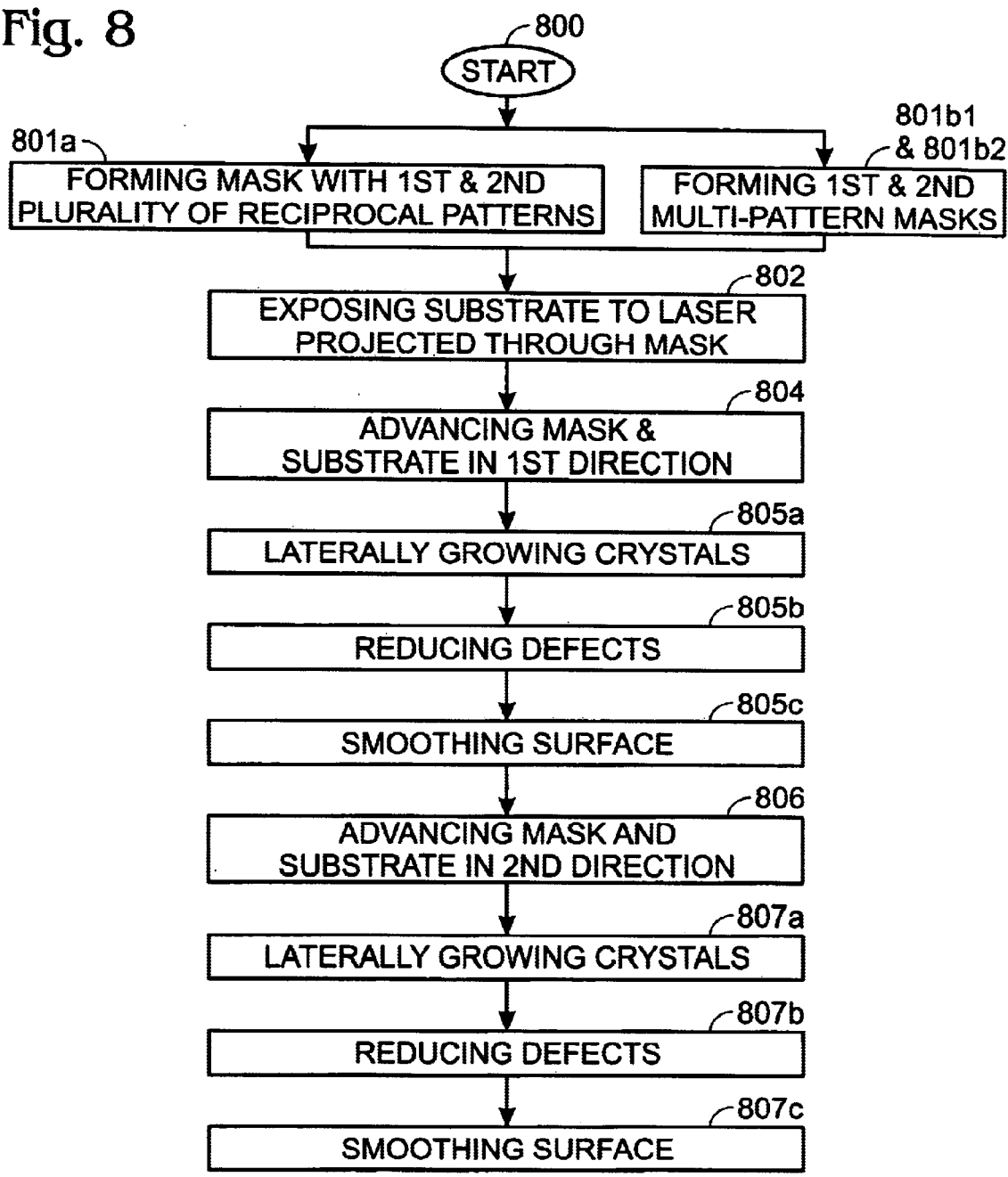

US 6,733,931 B2

SYMMETRICAL MASK SYSTEM AND METHOD FOR LASER IRRADIATION

BACKGROUND OF THE INVENTION

1. Field of the Invention

This invention generally relates to semiconductor fabrication, including polycrystalline silicon thin film transistors (TFTs) for active matrix (AM) liquid crystal displays (LCDs) and, more particularly, to a system and method for using a symmetrically patterned mask in laser annealing operations.

2. Description of the Related Art

FIG. 1 is an illustration of a laser annealing apparatus (prior art). One method to crystallize amorphous silicon (a-Si) films and obtain polycrystalline silicon (poly-Si) is by laser annealing. In one implementation of laser annealing, the laser beam is "shaped" by a mask that is inserted into the path of the beam. The shaped laser beam is then projected into the surface of the film to be annealed, by passing through an appropriate projection lens and associated optics.

The mask is kept at the mask stage. The substrate steps under the laser beam by means of a stage that can very accurately position and move both the mask and the substrate under the pulsed laser beam. The substrate and mask move in a serpentine pattern. The mask that is used to shape the laser beam can have a single pattern, or a variety of patterns on it. In the latter case, each time the laser discharges, the substrate and mask move at a precise distance, bringing the same area of the substrate under a different pattern of the mask. This allows the same area of the substrate to be irradiated under different conditions, with the objective of improving the resulting microstructure in a sequential manner. For example, one pattern of the mask may generate large lateral grain growth, another pattern reduces the density of grain defects generated after exposure to the first pattern, and a third pattern "smoothes-out" the surface of the poly-Si structure generated after exposure to the $1^{st}$ and $2^{nd}$ patterns. Generally, there may be as many patterns on the mask as the task requires. However, even though the number of patterns is unlimited, the exposure has to follow a specific sequence to have the desirable effect.

FIG. 2 illustrates a plan view of a mask with three patterns (prior art). Substrate motion under the mask is considered to be unilateral if the motion in one direction is followed by a motion in the opposite direction, after an edge of the substrate is reached. Although this movement is the most cost effective manner of operating the apparatus, a conventional multi-pattern mask cannot be used with such a unilateral motion. The three patterns create a specific exposure sequence in one direction that reverses when the substrate moves in an opposite direction. If the three-pattern sequence generates a beneficial effect in one direction, the effect is destroyed when the substrate motion is reversed to complete the serpentine pattern of exposure. Therefore, multi-pattern masks are conventionally used with respect to a single substrate direction. The time it takes for the substrate to reverse directions for the next pass of multi-patterned laser shots is wasted process time.

It would be advantageous if the laser annealing process time associated with the use of a multi-pattern mask could be improved.

It would be advantageous if a multi-pattern mask could be used in a laser apparatus that moves the substrates with a unilateral motion.

SUMMARY OF THE INVENTION

The present invention is invention discloses two related processes that enable a multi-region, or multi-pattern beam-masking scheme to be used with unilateral motion of a substrate. One process uses a pair of reciprocal pattern masks. One mask is used for substrate motion in a first direction, while the other mask is used for substrate motion in the opposite direction. The second process uses a single mask with reciprocal patterns.

Accordingly, a method is provided for efficiently laser irradiating a semiconductor substrate. The method comprises: exposing a semiconductor substrate to laser light projected through a multi-pattern mask; advancing the mask and substrate in a first direction to sequentially expose adjacent areas of the substrate to each of the mask patterns in a first predetermined order; and, advancing the mask and the substrate in a second direction, opposite the first direction, to sequentially expose adjacent areas of the substrate to each of the mask patterns in the first order.

In one aspect, the method further comprises: forming a multi-pattern mask having a first plurality patterns aligned in the first order with respect to the first direction and a second plurality of patterns, corresponding to the first plurality of patterns, aligned in the first order with respect to the second direction. Alternately, the method comprises: forming a first multi-pattern mask having a first plurality patterns aligned in the first order with respect to the first direction; and, forming a second multi-pattern mask having a second plurality of patterns, corresponding to the first plurality of patterns, aligned in the first order with respect to the second direction. Then, advancing the mask and substrate in the first direction includes using the first mask, and advancing the mask in the second direction includes using the second mask.

Advancing the mask and substrate in a first direction to sequentially expose adjacent areas of the substrate to each of the mask patterns in a first order includes exposing a first area of the substrate to laser light projected through a mask Region 2, followed by laser light projected through a mask Region 1. Likewise, advancing the mask and substrate in the second direction, opposite the first direction, to sequentially expose adjacent areas of the substrate to each of the mask patterns in the first order includes exposing a second area of the substrate to laser light projected through the mask Region 2, followed by laser light projected through the mask Region 1. The method further comprises: forming a first condition in the substrate in response to light projected through mask Region 2; and, modifying the first condition in the substrate in response to light projected through mask Region 1.

Additional details of the above-described method, and a system for efficiently laser irradiating a semiconductor substrate using a multi-patterned mask are presented below.

BRIEF DESCRIPTION OF THE DRAWINGS

FIG. 8 is a flowchart illustrating the present invention method for efficiently laser irradiating a semiconductor substrate with a multi-pattern mask.

DETAILED DESCRIPTION OF THE PREFERRED EMBODIMENTS

Figure 1:
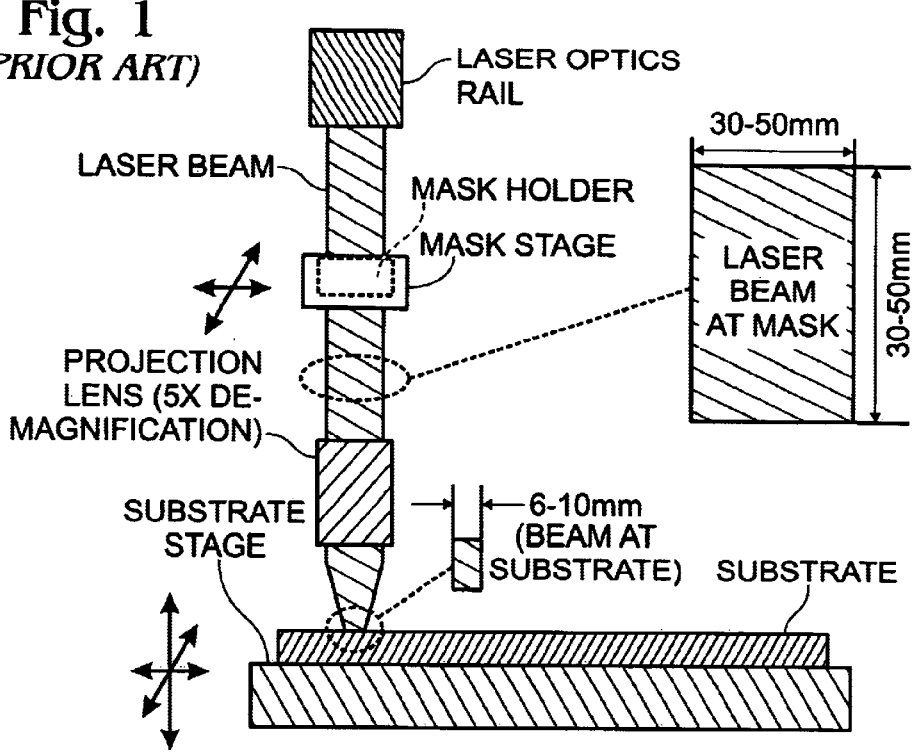
FIG. 1 is an illustration of a laser annealing apparatus (prior art).
Figure 2:
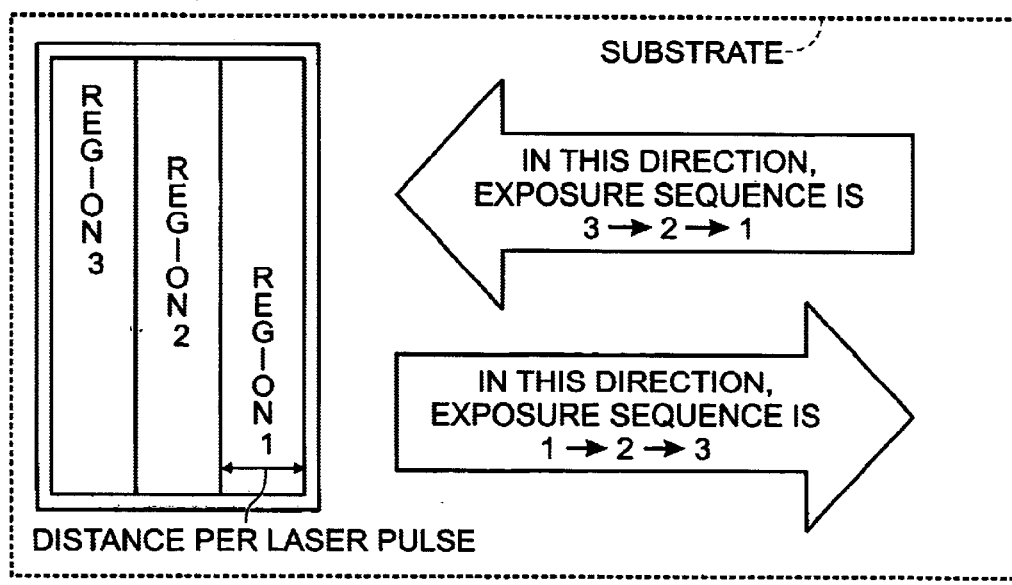
FIG. 2 illustrates a plan view of a mask with three patterns (prior art).
Figure 3:
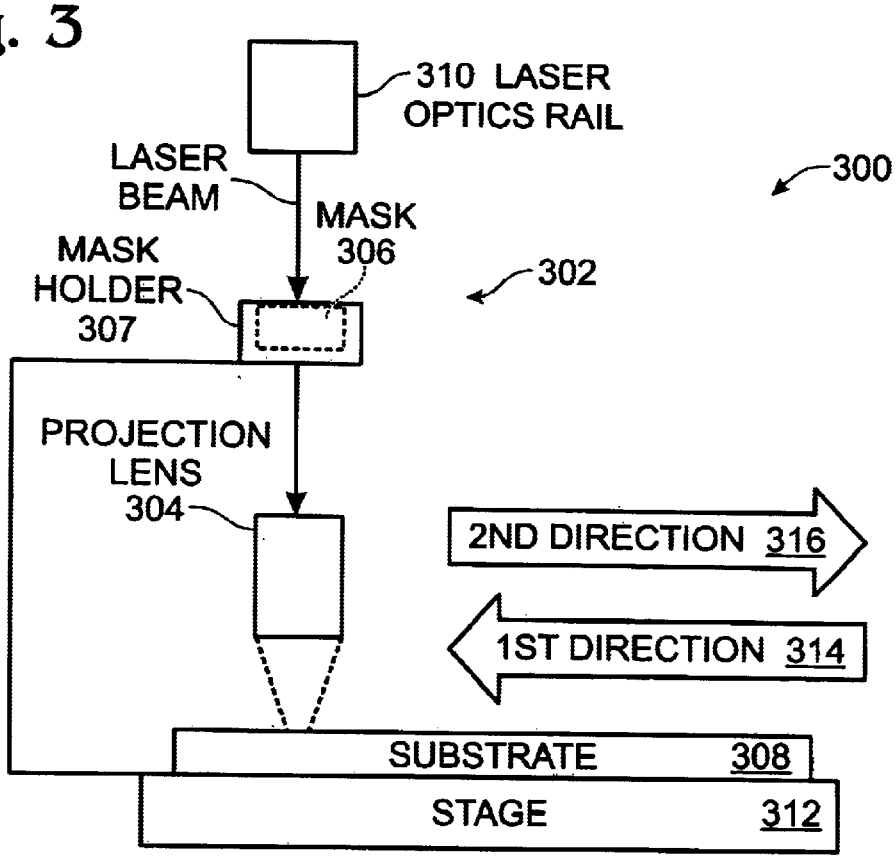
FIG. 3 is a schematic block diagram illustrating the present invention system for efficiently laser irradiating a semiconductor substrate with a multi-pattern mask.

FIG. 3 is a schematic block diagram illustrating the present invention system for efficiently laser irradiating a semiconductor substrate with a multi-pattern mask. The system 300 comprises an optical system 302 including a laser (not shown) and a projection lens 304. Optical elements include beam attenuators, telescope lenses (used to shape the raw beam), homogenizers (used to homogenize the beam energy profile in 2-D), a field lens, a masking system and a projection lens. Other elements may also be included in the optical path, as necessary. The system 300 also comprises a multi-pattern mask 306 and mask holder 307.

Figure 4:
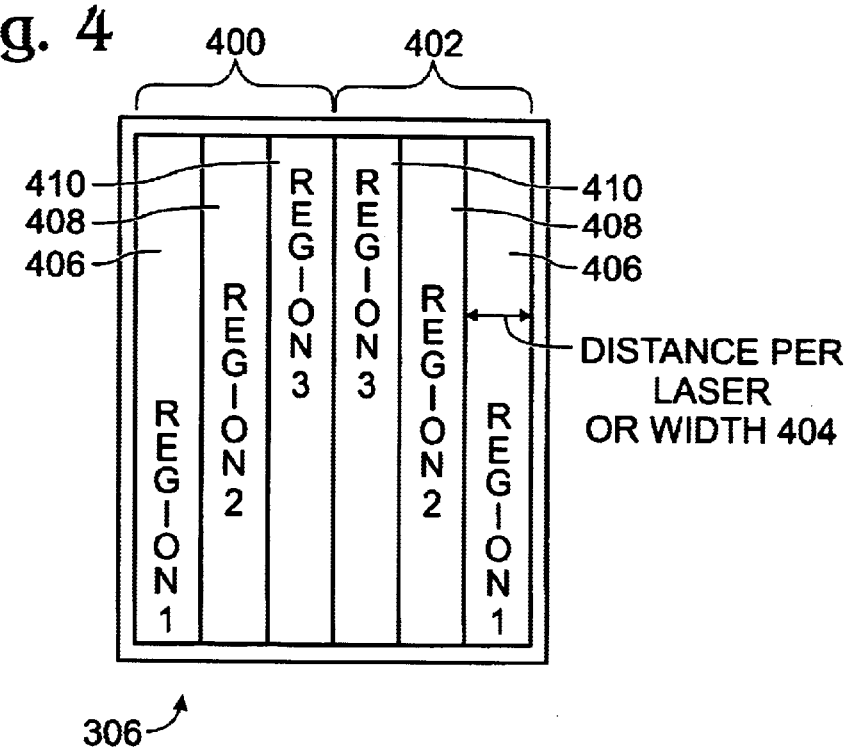
FIG. 4 is a plan view of the present invention multi-pattern mask.

FIG. 4 is a plan view of the present invention multi-pattern mask. The mask 306 includes a first plurality of patterns 400 arranged in a first order and a second plurality of patterns 402, corresponding to the first plurality of patterns, arranged in an order reciprocal to the first order. Each of the first plurality of patterns 400 has a width 404, as do each of the second plurality of patterns. Typically, all the widths are equal. As shown, the first plurality of patterns 400 in the first order includes a Region 1 (406), adjacent a Region 2 (408), in a left-justified order. The second plurality of patterns 402 corresponding to the first plurality of patterns 400 in the order reciprocal to the first order includes a Region 1 (406), adjacent a Region 2 (408), in a right-justified order. Specifically shown are Regions 1 (406) through Region 3 (410), however, the invention is not limited to any particular number of regions.

Returning to FIG. 3, the mask 306 and the substrate 308 are moveably mounted to a stage 312. The stage 312 moves the mask 306 and substrate 308 in lockstep with respect to the optical system 304. The stage 312 advances the mask 306 and substrate 308 in a first direction 314 to sequentially expose adjacent areas (of the substrate 308) to each of the mask patterns in a first predetermined order. Then, at the end of the line, the stage 312 advances the mask 306 and substrate 308 in a second direction 316, opposite the first direction 314, to sequentially expose adjacent areas to each of the mask patterns in the first order. As seen in FIG. 4, the first and second plurality of mask patterns each have a width, and the stage 312 moves the mask 306 and substrate 308 a first distance equal to the width.

Contrasting FIGS. 3 and 4, the first plurality of mask patterns 400 are arranged in the first order that includes Region 1 (406), adjacent Region 2 (408), adjacent Region 3 (410), in a left-justified order. The stage 312 advances the mask 306 and substrate 308 in a first direction to sequentially expose a first area of substrate 308 to light exposure through mask Region 3 (410), followed by Region 2 (408), followed by Region 1 (406). Likewise, the second plurality of mask patterns 402 are arranged in the order reciprocal to the first order that includes Region 1 (406), adjacent Region 2 (408), adjacent Region 3 (410), in a right-justified order. The stage 312 advances the mask 306 and substrate 308 in the second direction 316 to sequentially expose a second area of the substrate 308 to light exposure through mask Region 3 (410), followed by Region 2 (408), followed by Region 1 (406).

Figure 5:
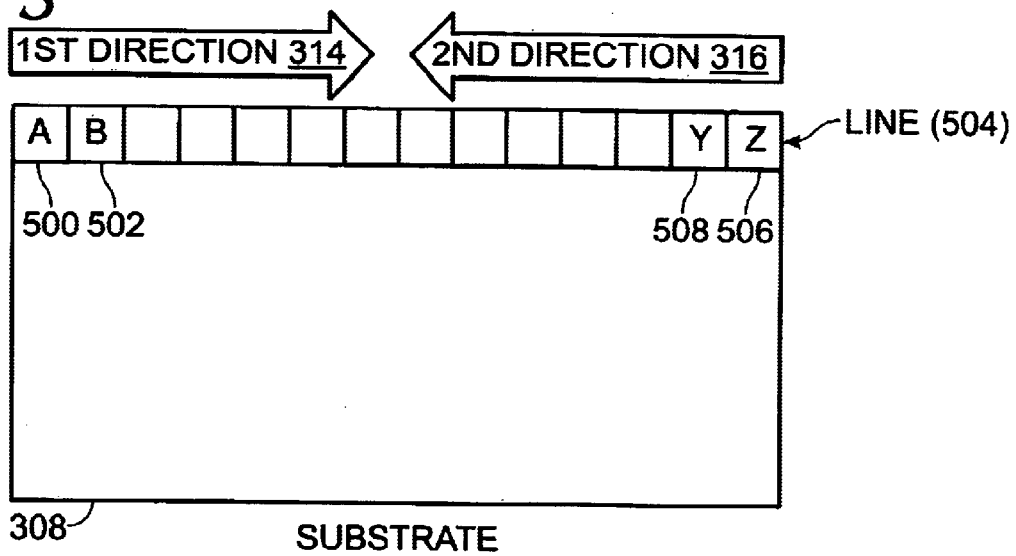
FIG. 5 is a plan view of the top surface of the substrate of FIG. 3.

FIG. 5 is a plan view of the top surface of the substrate 308 of FIG. 3. The stage advances the mask (not shown) and substrate 308 in the first direction 314 to sequentially expose adjacent areas of the substrate 308 to each of the mask patterns in a first predetermined order. For example, Area A (500) is adjacent to Area B (502). At the end of the line 504, the stage advances the mask in a second direction 316 to sequentially expose adjacent areas of the substrate to each of the mask patterns in the first order. For example, Area Z (506) is adjacent to Area Y (508). The substrate forms in a first condition in response to light projected through mask Region 2, and the substrate first condition is modified in response to light projected through mask Region 1, subsequent to the mask Region 2.

Figure 6A:
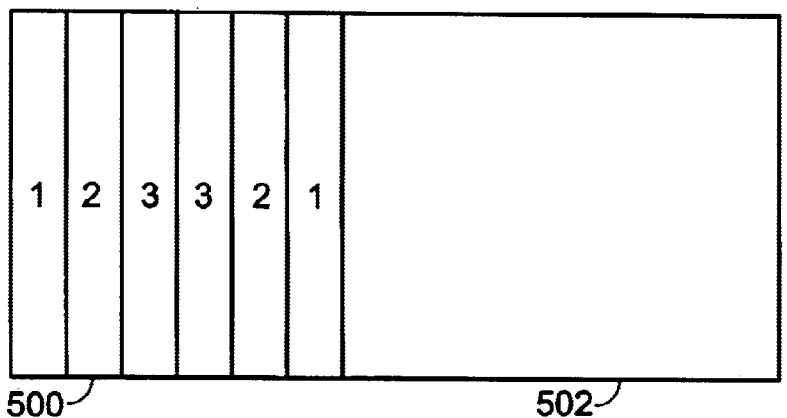
FIGS. 6a and 6d are detailed depictions of Areas A and B of FIG. 5, illustrating the step-and-repeat motion of the mask and substrate in the first direction.
Figure 6B:
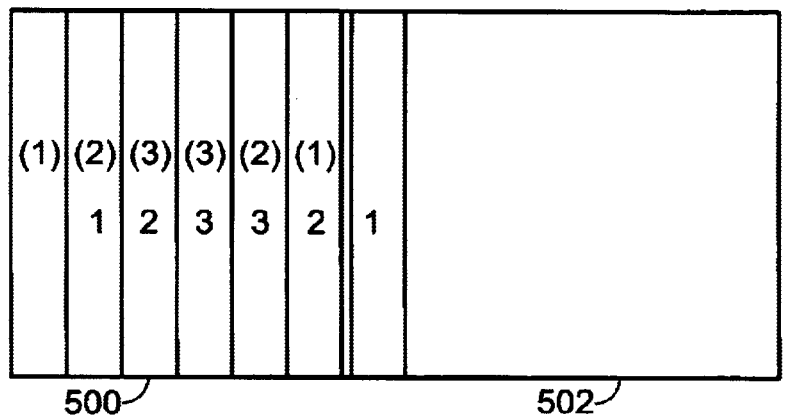

FIGS. 6a and 6d are detailed depictions of Areas A (500) and B (502) of FIG. 5, illustrating the step-and-repeat motion of the mask and substrate in the first direction. In FIG. 6a, Area A (500) is exposed to all six patterns of the mask, both the first and second plurality of patterns. In FIG. 6b the mask and substrate have moved a first distance equal to a pattern width. Parts of the area are exposed to the pattern next in the first order sequence. For example, Region 1 of the mask is exposing a part of the area, marked with the number "1", that was previous exposed to Region 2 of the mask, marked with the number "(2)". Note that Area A is initially conditioned with the second plurality of mask patterns, but that the conditioning is finished with the first plurality of mask patterns in the first order.

As shown in FIG. 4, the mask 306 includes a first plurality of three patterns 400 and a second plurality of three patterns 402. The stage advances the mask and substrate in the first direction to sequentially expose a first area to light exposure through mask Region n, where n equals 3, followed by Region 2, followed by Region 1. The substrate condition changes as follows: the length of crystal grains are laterally grown in Area A in response to light exposure through Region 3; the density of grain defects in reduced in Area A in response to light exposure through Region 2; and, the surface of Area A is smoothed in response to light exposure through Region n.

Likewise, when the stage advances the mask and substrate in the second direction to sequentially expose a second area, for example Area Z, to light exposure through mask Region n (3), followed by Region 2, followed by Region 1. The substrate condition changes as follows: the length of crystal grains are laterally grown in the area in response to light exposure through Region 3; the density of grain defects in reduced in the area in response to light exposure through Region 2; and, the area surface is smoothed in response to light exposure through Region 1. It should be understood that the above-mentioned three-step conditioning process is merely one example of multi-step substrate conditioning using a multi-pattern mask. Also note that Area A at the end of the line, when the mask and substrate move in the second direction, would be reconditioned, or conditioned again as explained above.

Returning to FIG. 3, in another aspect of the system 300, a mask-pair is used. Then, the system 300 would include a conventional mask changing apparatus, as a part of the mask holder 307, for switching between a first mask and a second mask of a mask-pair.

Figure 7:
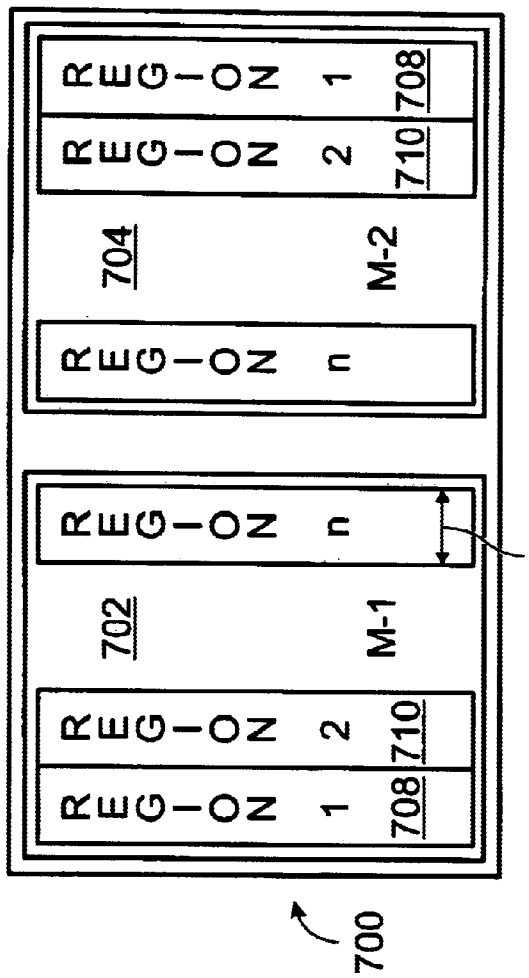
FIG. 7 is a plan view of the present invention mask-pair.
Figure 7:
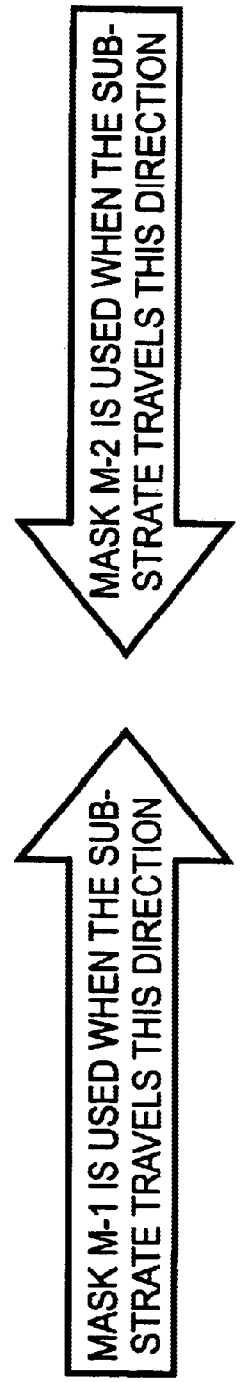

FIG. 7 is a plan view of the present invention mask-pair 700. A first mask (M-1) 702 has a first plurality of patterns arranged in a first order. Shown are Region 1, Region 2, and Region n. A second mask (M-2) 704 has a second plurality of patterns, corresponding to the first plurality of patterns, arranged in an order reciprocal to the first order. The first mask first plurality of patterns each have a width 706, as does the second mask second plurality of patterns. The stage (See FIG. 3) moves each mask (and the substrate) a first distance equal to the width. The first mask first plurality of patterns are arranged in the first order that includes a Region 1 (708), adjacent a Region 2 (710), in a left-justified order. The mask can have up to n regions, where n is any integer. The stage advances the first mask and substrate in a first direction to sequentially expose a first area to light exposure through mask Region 2, followed by Region 1. The second mask second plurality of patterns are arranged in the order reciprocal to the first order that includes a Region 1 (708), adjacent a Region 2 (710), in a right-justified order. The stage advances the second mask and substrate in a second direction to sequentially expose a second area to light exposure through mask Region 2, followed by Region 1.

Some of the features of the alternate aspect of the 300 are the same as the first aspect explained above, and will not be repeated in the interest of brevity. Returning to FIG. 3, the stage 312 advances the first mask and substrate in the first direction 314 to sequentially expose adjacent areas to each of the first mask patterns in a first predetermined order. Likewise, the stage advances the second mask and substrate in a second direction to sequentially expose adjacent areas to each of the second mask patterns in the first order.

The substrate 308 forms in a first condition in response to light projected through Region 2, and the substrate first condition is modified in response to light projected through Region 1, subsequent to the Region 2. For example, the first and second masks include a first and second plurality, respectively, of three patterns. The stage advances the first mask and substrate in a first direction to sequentially expose a first area to light exposure through mask Region n (where n=3), followed by Region 2, followed by Region 1. The substrate condition changes as follows: the length of crystal grains are laterally grown in an area in response to light exposure through Region 3; the density of grain defects in reduced in the area in response to light exposure through Region 2; and, the area surface is smoothed in response to light exposure through Region 3. Likewise, the stage advances the second mask and substrate in a second direction to sequentially expose a second area to light exposure through mask Region 3, followed by Region 2, followed by Region 1, and the substrate condition changes as described above.

Functional Description

Both aspects of the system described above permit a multi-pattern mask to be used with a substrate in unilateral motion. However, when a single mask is used with three reciprocal patterns, the film is unnecessarily irradiated three times before the three appropriate patterns for the particular direction of motion are applied. The effect of the additional irradiations to the microstructure may not necessarily be beneficial for all processes. Further, the per-pulse translation distance (distance traveled) of the substrate decreases as the number of different regions on the mask increases. If the number of regions increases ×2, the per-pulse translation distance decreases ×2. This means that the substrate translation velocity for a given laser discharge frequency decreases by the same factor. This also means that the throughput of the crystallization process decreases.

To circumvent these potential limitations of a single-mask approach, the mask-pair approach can be used. Each mask is a mirror copy of the other. The masks are housed at the mask stage and are interchanged every time the edge of the panel is reached, signaling the completion of a line. The motion of the mask stage occurs simultaneously with the motion of the panel (i.e. motion to go to next line), hence, no time overhead is required for the mask-changing process.

FIG. 7 shows an example of the mask mirror designs. Each mask is a mirror copy of the other. The number of regions on each mask is determined by the designer's objectives. As long as the same number of regions are placed on each mask (with mirrored location), there are no constrains on the number of regions. Again, however, the substrate translation velocity is inversely affected by a larger number of mask regions.

The procedure to conduct laser crystallization using the mask-pair is summarized as follows:

1. Load masks and substrate on the appropriate stages. Initialize/home stages;
2. Bring first mask under the beam;
3. Anneal substrate with the substrate moving along the direction matching the pattern sequence of the first mask;
4. When edge of substrate is reached: check if all of the substrate has been annealed. If yes go to step 7. If not, move substrate to the next row to be annealed and simultaneously retract the first mask and move the second mask under the beam;
5. Anneal substrate with the substrate moving along the direction matching the pattern sequence of the second mask;
6. When edge of substrate is reached: check if all of the substrate has been annealed. If yes go to step 7. If not, move substrate to the next row to be annealed and simultaneously retract the second mask and move the first mask under the beam. Go to step 3; and,
7. Substrate crystallization completed.

FIG. 8 is a flowchart illustrating the present invention method for efficiently laser irradiating a semiconductor substrate with a multi-pattern mask. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 800. Step 802 exposes a semiconductor substrate to laser light projected through a multi-pattern mask. Step 804 advances the mask and the substrate in a first direction to sequentially expose adjacent areas of the substrate to each of the mask patterns in a first predetermined order. Step 806 advances the mask and substrate in a second direction, opposite the first direction, to sequentially expose adjacent areas of the substrate to each of the mask patterns in the first order.

In some aspects of the method Step 801a forms a multi-pattern mask having a first plurality patterns aligned in the first order with respect to the first direction and a second plurality of patterns, corresponding to the first plurality of patterns, aligned in the first order with respect to the second direction. Forming a multi-pattern mask having a first plurality patterns aligned in the first order with respect to the first direction includes forming a first Region 1, adjacent a first Region 2, with respect to first direction. Forming a second plurality of patterns aligned in the first order with respect to the second direction includes forming a second Region 1, adjacent a second Region 2, with respect to second direction.

Alternately, Step 801*b*1 forms a first multi-pattern mask having a first plurality patterns aligned in the first order with respect to the first direction. Step 801*b*2 forms a second multi-pattern mask having a second plurality of patterns, corresponding to the first plurality of patterns, aligned in the first order with respect to the second direction.

Forming a first multi-pattern mask having a first plurality patterns aligned in the first order with respect to the first direction in Step 801*b*1 includes forming a first Region 1, adjacent a first Region 2, with respect to first direction. Forming a second multi-pattern mask with a second plurality of patterns aligned in the first order with respect to the second direction in Step 801*b*2 includes forming a second Region 1, adjacent a second Region 2, with respect to second direction. Advancing the mask and substrate in a first direction to sequentially expose adjacent areas of the substrate to each of the mask patterns in a first predetermined order in Step 804 includes using the first mask. Advancing the mask and substrate in a second direction, opposite the first direction, to sequentially expose adjacent areas of the substrate to each of the mask patterns in the first order in Step 806 includes using the second mask.

Regardless of whether a single mask or a mask-pair is used, each pattern has a width. The widths are equal. Advancing the mask and substrate a first direction in Step 804 includes advancing a first distance equal to the width. Advancing the mask and substrate a second direction in Step 806 includes advancing a first distance equal to the width.

In some aspects, advancing the mask and substrate in a first direction in Step 804 includes exposing a first area of the substrate to laser light projected through a mask Region 2, followed by laser light projected through a mask Region 1. Advancing the mask and substrate in a second direction, opposite the first direction, in Step 806 includes exposing a second area of the substrate to laser light projected through mask Region 2, followed by laser light projected through mask Region 1.

In some aspects of the method Step 804 (or Step 806) forms a first condition in the substrate in response to light projected through mask Region 2. Step 804 (or Step 806) continues by modifying the first condition in the substrate in response to light projected through mask Region 1.

In some aspects, exposing a semiconductor substrate to laser light projected through a multi-pattern mask in Step 802 includes exposing a silicon substrate to a three-pattern mask. That is, a single mask with three patterns matched with three reciprocal patterns, or a mask-pair each having three patterns. Then, advancing the mask and substrate in a first direction to sequentially expose adjacent areas of the substrate to each of the mask patterns in a first predetermined order in Step 804 includes exposing a first substrate area to light exposure through mask Region n (where n=3), followed by Region 2, followed by Region 1. Step 805*a* laterally grows the length of crystal grains in the first area in response to light exposure through Region 3. Step 805*b* reduces the density of grain defects in the first area in response to light exposure through Region 2. Step 805*c* smoothes the substrate surface in the first area in response to light exposure through Region 1.

Likewise, advancing the mask and substrate in a second direction to sequentially expose adjacent areas of the substrate to each of the mask patterns in a first predetermined order in Step 806 includes exposing a second substrate area to light exposure through mask Region n (where n=3), followed by Region 2, followed by Region 1. Step 807*a* laterally grows the length of crystal grains in the area in response to light exposure through Region 3. Step 807*b* reduces the density of grain defects in the second area in response to light exposure through Region 2. Step 807*c* smoothes the substrate surface in the second area in response to light exposure through Region 1.

A system and method have been provided for annealing a silicon substrate with a multi-pattern mask in a unilateral direction. Examples have been given of specific numbers of patterns and of specific process objectives. However, the present invention is not limited to merely these examples. Other variations and embodiments of the invention will occur to those skilled in the art.

We claim:

1. A method for efficiently laser irradiating a semiconductor substrate, the method comprising:

exposing a semiconductor substrate to laser light projected through a multi-pattern mask;

advancing the mask and the substrate in a first direction to sequentially expose adjacent areas of the substrate to each of the mask patterns in a first predetermined order; and, advancing the mask and the substrate in a second direction, opposite the first direction, to sequentially expose adjacent areas of the substrate to each of the mask patterns in the first order.

2. The method of claim 1 further comprising:

forming a multi-pattern mask having a first plurality patterns aligned in the first order with respect to the first direction and a second plurality of patterns, corresponding to the first plurality of patterns, aligned in the first order with respect to the second direction.

3. The method of claim 2 wherein forming a multi-pattern mask having a first plurality patterns aligned in the first order with respect to the first direction includes forming a first Region 1 adjacent a first Region 2 with respect to first direction; and, wherein forming a second plurality of patterns aligned in the first order with respect to the second direction includes forming a second Region 1, adjacent a second Region 2, with respect to second direction.

4. The method of claim 1 further comprising:

forming a first multi-pattern mask having a first plurality patterns aligned in the first order with respect to the first direction; and, forming a second multi-pattern mask having a second plurality of patterns, corresponding to the first plurality of patterns, aligned in the first order with respect to the second direction.

5. The method of claim 4 wherein forming a first multi-pattern mask having a first plurality patterns aligned in the first order with respect to the first direction includes forming a first Region 1, adjacent a first Region 2, with respect to first direction; and, wherein forming a second multi-pattern mask with a second plurality of patterns aligned in the first order with respect to the second direction includes forming a second Region 1, adjacent a second Region 2, with respect to second direction.

6. The method of claim 4 wherein advancing the mask and the substrate in a first direction, to sequentially expose adjacent areas of the substrate to each of the mask patterns in a first predetermined order includes using the first mask; and, advancing the mask and the substrate in a second direction, opposite the first direction, to sequentially expose adjacent areas of the substrate to each of the mask patterns in the first order includes using the second mask.

7. The method of claim 1 wherein each pattern has a width;
   wherein advancing the mask and the substrate in a first direction includes advancing a first distance equal to the width; and,
   wherein advancing the mask and the substrate a second direction, opposite the first direction, includes advancing a first distance equal to the width.

8. The method of claim 1 wherein advancing the mask and the substrate in a first direction to sequentially expose adjacent areas of the substrate to each of the mask patterns in a first predetermined order includes exposing a first area of the substrate to laser light projected through a mask Region 2, followed by laser light projected through a mask Region 1; and,
   wherein advancing the mask and the substrate in a second direction, opposite the first direction, to sequentially expose adjacent areas of the substrate to each of the mask patterns in the first order includes exposing a second area of the substrate to laser light projected through mask Region 2, followed by laser light projected through Region 1.

9. The method of claim 8 wherein advancing the mask and the substrate in a first direction to sequentially expose adjacent areas of the substrate to each of the mask patterns in a first predetermined order includes:
   forming a first condition in the substrate in response to light projected through mask Region 2; and,
   modifying the first condition in the substrate in response to light projected through mask Region 1.

10. The method of claim 8 wherein exposing a semiconductor substrate to laser light projected through a multi-pattern mask includes exposing a silicon substrate to a three-pattern mask;
   wherein advancing the mask and the substrate in a first direction to sequentially expose adjacent areas of the substrate to each of the mask patterns in a first predetermined order includes exposing a first substrate area to light exposure through mask Region 3, followed by Region 2, followed by Region 1; and,
   the method further comprising:
      laterally growing the length of crystal grains in the first area in response to light exposure through Region 3;
      reducing the density of grain defects in the first area in response to light exposure through Region 2; and,
      smoothing the substrate surface in the first area in response to light exposure through Region 1.

11. The method of claim 10 wherein advancing the mask and the substrate in a second direction, opposite the first direction, to sequentially expose adjacent areas of the substrate to each of the mask patterns in a first predetermined order includes exposing a second substrate area to light exposure through mask Region 3, followed by Region 2, followed by Region 1; and,
   the method further comprising:
      laterally growing the length of crystal grains in the second area in response to light exposure through Region 3;
      reducing the density of grain defects in the second area in response to light exposure through Region 2; and,
      smoothing the substrate surface in the second area in response to light exposure through Region 1.

12. A laser conditioning multi-pattern mask comprising:
   a first plurality of patterns arranged in a first order; and,
   a second plurality of patterns, corresponding to the first plurality of patterns, arranged in an order reciprocal to the first order.

13. The mask of claim 12 wherein the first plurality of patterns each have a width; and,
   wherein the second plurality of patterns each have the width.

14. The mask of claim 12 wherein the first plurality of patterns in the first order includes a Region 1, adjacent a Region 2, in a left-justified order; and,
   wherein the second plurality of patterns corresponding to the first plurality of patterns in the order reciprocal to the first order includes a Region 1, adjacent a Region 2, in a right-justified order.

15. A laser conditioning multi-pattern mask-pair comprising:
   a first mask with a first plurality of patterns arranged in a first order; and,
   a second mask with a second plurality of patterns, corresponding to the first plurality of patterns, arranged in an order reciprocal to the first order.

16. The mask-pair of claim 15 wherein the first mask first plurality of patterns each have a width; and,
   wherein second mask second plurality of patterns each have the width.

17. The mask-pair of claim 15 wherein the first mask first plurality of patterns are arranged in the first order that includes a Region 1, adjacent a Region 2, in a left-justified order; and,
   wherein the second mask second plurality of patterns are arranged in the order reciprocal to the first order that includes a Region 1, adjacent a Region 2, in a right-justified order.

18. A system for efficiently laser irradiating a semiconductor substrate, the system comprising:
   an optical system including a laser and a projection lens;
   a mask including a first plurality of patterns arranged in a first order and a second plurality of patterns, corresponding to the first plurality of patterns, arranged in an order reciprocal to the first order; and,
   a stage for moving the mask with respect to an optical system.

19. The system of claim 18 wherein the stage advances the mask in a first direction to sequentially expose adjacent areas to each of the mask patterns in a first predetermined order; and
   wherein the stage advances the mask in a second direction, opposite the first direction, to sequentially expose adjacent areas to each of the mask patterns in the first order.

20. The system of claim 19 wherein the first and second plurality of mask patterns each have a width; and,
   wherein the stage moves the mask a first distance equal to the width.

21. The mask of claim 20 wherein the first plurality of mask patterns arranged in the first order includes a Region 1, adjacent a Region 2, in a left-justified order;
   wherein the stage advances the mask in a first direction to sequentially expose a first area to Region 2, followed by Region 1;
   wherein the second plurality of mask patterns arranged in the order reciprocal to the first order includes a Region 1, adjacent a Region 2, in a right justified order; and,
   wherein the stage advances the mask in a second direction to sequentially expose a second area to Region 2, followed by Region 1.

22. The system of claim 19 further comprising:
   a substrate moveably mounted to the stage;

wherein the stage advances the mask and the substrate in the first direction to sequentially expose adjacent areas of the substrate to each of the mask patterns in a first predetermined order; and, wherein the stage advances the mask and the substrate in the second direction to sequentially expose adjacent areas of the substrate to each of the mask patterns in the first order.

23. The system of claim 22 wherein the substrate forms in a first condition in response to light projected through mask Region 2 and the substrate first condition is modified in response to light projected through mask Region 1, subsequent to mask Region 2.

24. The system of claim 23 wherein the mask includes a first plurality of three patterns and a second plurality of three patterns;

wherein the stage advances the mask and the substrate in the first direction to sequentially expose a first area to light exposure through mask Region 3, followed by Region 2, followed by Region 1; and, wherein the substrate condition changes as follows:
the length of crystal grains are laterally grown in the first area in response to light exposure through Region 3;
the density of grain defects in reduced in the first area in response to light exposure through Region 2; and,
the first area surface is smoothed in response to light exposure through Region 1.

25. The system of claim 24 wherein the stage advances the mask and the substrate in the second direction to sequentially expose a second area to light exposure through mask Region 3, followed by Region 2, followed by Region 1; and, wherein the substrate condition changes as follows:
the length of crystal grains are laterally grown in the second area in response to light exposure through Region 3;
the density of grain defects in reduced in the second area in response to light exposure through Region 2; and,
the second area surface is smoothed in response to light exposure through Region 1.

26. A system for efficiently laser irradiating a semiconductor substrate, the system comprising:

an optical system including a laser and a projection lens;
a first mask including a first plurality of patterns arranged in a first order;
a second mask including a second plurality of patterns, corresponding to the first plurality of patterns, arranged in an order reciprocal to the first order; and,
a stage for moving the with respect to the optical system.

27. The system of claim 26 wherein the stage advances the first mask in a first direction to sequentially expose adjacent areas to each of the first mask patterns in a first predetermined order; and wherein the stage advances the second mask in a second direction, opposite the first direction, to sequentially expose adjacent areas to each of the second mask patterns in the first order.

28. The system of claim 27 wherein the first mask first plurality of mask patterns each have a width;

wherein the second mask second plurality of mask patterns each have a width; and, wherein the stage moves each mask a first distance equal to the width.

29. The mask of claim 28 wherein the first mask first plurality of mask patterns are arranged in the first order that includes a Region 1, adjacent a Region 2, in a left-justified order;

wherein the stage advances the first mask in the first direction to sequentially expose a first area to light exposure through mask Region 2, followed by Region 1;

wherein the second mask second plurality of mask patterns are arranged in the order reciprocal to the first order that includes a Region 1, adjacent a Region 2, in a right-justified order; and, wherein the stage advances the second mask in the second direction to sequentially expose a second area to light exposure through mask Region 2, followed by Region 1.

30. The system of claim 27 further comprising:
a substrate moveably mounted to the stage;
wherein the stage advances the first mask and the substrate in the first direction to sequentially expose adjacent areas of the substrate to each of the first mask patterns in a first predetermined order; and,
wherein the stage advances the second mask and substrate in the second direction, opposite the first direction, to sequentially expose adjacent areas of the substrate to each of the second mask patterns in the first order.

31. The system of claim 30 wherein the substrate forms in a first condition in response to light projected through mask Region 2 and the substrate first condition is modified in response to light projected through mask Region 1, subsequent to mask Region 2.

32. The system of claim 31 wherein the first mask includes a first plurality of three patterns and the second mask includes a second plurality of three patterns;

wherein the stage advances the first mask and substrate in the first direction to sequentially expose a first area to light exposure through mask Region 3, followed by Region 2, followed by Region 1; and, wherein the substrate condition changes as follows:
the length of crystal grains are laterally grown in the first area in response to light exposure through Region 3;
the density of grain defects in reduced in the first area in response to light exposure through Region 2; and,
the first area surface is smoothed in response to light exposure through Region 1.

33. The system of claim 32 wherein the stage advances the second mask and the substrate in a second direction to sequentially expose a second area to light exposure through mask Region 3, followed by Region 2, followed by Region 1; and, wherein the substrate condition changes as follows:
the length of crystal grains are laterally grown in the second area in response to light exposure through Region 3;
the density of grain defects in reduced in the second area in response to light exposure through Region 2; and,
the second area surface is smoothed in response to light exposure through Region 1.

* * * * *